United States Patent
Silvernail

(10) Patent No.: US 6,624,568 B2
(45) Date of Patent: Sep. 23, 2003

(54) MULTILAYER BARRIER REGION CONTAINING MOISTURE- AND OXYGEN-ABSORBING MATERIAL FOR OPTOELECTRONIC DEVICES

(75) Inventor: Jeffrey Alan Silvernail, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 102 days.

(21) Appl. No.: 09/819,375

(22) Filed: Mar. 28, 2001

(65) Prior Publication Data

US 2003/0117066 A1 Jun. 26, 2003

(51) Int. Cl.[7] .............................. H01J 1/62; H01J 63/04
(52) U.S. Cl. ........................................ 313/504; 313/506
(58) Field of Search ................................ 313/504, 506, 313/509, 512

(56) References Cited

U.S. PATENT DOCUMENTS

| | | | |
|---|---|---|---|
| 4,357,557 A | 11/1982 | Inohara et al. ............... 313/509 |
| 5,051,654 A | 9/1991 | Nativi et al. ................. 313/506 |
| 5,707,745 A | 1/1998 | Forrest et al. ............... 428/432 |
| 5,757,126 A * | 5/1998 | Harvey et al. ............... 313/504 |
| 5,771,562 A | 6/1998 | Harvey, III et al. ........ 29/592.1 |
| 5,882,761 A | 3/1999 | Kawami et al. .............. 428/69 |
| 5,952,778 A | 9/1999 | Haskal et al. ................ 313/504 |
| 5,962,962 A | 10/1999 | Fujita et al. ................. 313/412 |
| 6,083,313 A | 7/2000 | Venkatraman et al. . 106/287.14 |
| 6,104,137 A * | 8/2000 | Abiko et al. ................. 313/503 |
| 6,146,225 A | 11/2000 | Sheats et al. ................. 445/24 |
| 6,413,645 B1 * | 7/2002 | Graff et al. .................. 426/126 |

FOREIGN PATENT DOCUMENTS

| | | | |
|---|---|---|---|
| EP | 0 977 469 A2 | 2/2000 | ........... H05B/33/04 |
| JP | 07916569 | 7/1995 | ........... H05B/33/04 |
| JP | 09153395 | 6/1997 | ........... H03B/33/22 |
| WO | WO 99/02277 | 1/1999 | ........... B05D/5/12 |
| WO | WO 99/39393 | 8/1999 | ........... H01L/51/20 |
| WO | WO 00/26973 | 5/2000 | ........... H01L/51/20 |
| WO | WO 00/36665 | 6/2000 | ........... H01L/51/20 |
| WO | WO 00/65879 | 11/2000 | ........... H05B/33/12 |

\* cited by examiner

*Primary Examiner*—Sandra O'Shea
*Assistant Examiner*—Peter Macchiarolo
(74) *Attorney, Agent, or Firm*—Mayer Fortkort & Williams, PC; David B. Bonham, Esq.

(57) ABSTRACT

An organic optoelectronic device structure is provided that comprises the following: (a) a polymer substrate layer; (b) a first barrier region, which comprises two or more planarizing layers and two or more high-density layers, disposed over the polymer substrate layer; (c) a second barrier region, which comprises two or more planarizing layers, two or more high-density layers and at least one layer of an absorbing material that absorbs water, oxygen or both water and oxygen, disposed over the first barrier region; and (d) an organic optoelectronic device, which is selected from an organic light emitting diode, an organic electrochromic display, an organic photovoltaic device and an organic thin film transistor, disposed between the first and second barrier regions. The first and second barrier regions in this structure restrict transmission of water and oxygen from an outer environment to the optoelectronic device.

21 Claims, 6 Drawing Sheets

MULTILAYER BARRIER REGION CONTAINING MOISTURE- AND OXYGEN-ABSORBING MATERIAL FOR OPTOELECTRONIC DEVICES

FIELD OF THE INVENTION

The present invention relates to structures that protect organic optoelectronic devices from species in the surrounding environment.

BACKGROUND OF THE INVENTION

Organic optoelectronic devices, including circuits, such as organic light emitting diodes, organic electrochromic displays, organic photovoltaic devices and organic thin film transistors, are known in the art and are becoming increasingly important from an economic standpoint.

As a specific example, organic light emitting devices ("OLEDs"), including both polymer and small-molecule OLEDs, are potential candidates for a great variety of virtual- and direct-view type displays, such as lap-top computers, televisions, digital watches, telephones, pagers, cellular telephones, calculators and the like. Unlike inorganic semiconductor light emitting devices, organic light emitting devices are generally simple and relatively easy and inexpensive to fabricate. Also, OLEDs readily lend themselves to applications requiring a wide variety of colors and to applications that concern large-area devices. In general, two-dimensional OLED arrays for imaging applications are known in the art and are typically composed of a plurality of OLEDs (one or more of which forms a pixel) arranged in rows and columns. Each individual OLED in the array is typically constructed with a first transparent anode (such as ITO), an organic electroluminescent layer on the first electrode, and a metallic cathode on the organic electroluminescent medium. Other OLED architectures are also known in the art such as transparent OLEDs (transparent cathode contact), and inverted OLEDs. Substrate materials may include glass, plastic, metal foil, silicon wafers, and so forth.

In forming an OLED, a layer of reactive metal is typically utilized as the cathode to ensure efficient electron injection and low operating voltages. However, reactive metals and their interface with the organic material are susceptible to oxygen and moisture, which can severely limit the lifetime of the devices. Moisture and oxygen are also known to produce other deleterious effects. For example, moisture and oxygen are known to increase "dark spot areas" in connection with OLEDs. Components of various other organic optoelectronic devices (e.g., organic electrochromic displays, organic photovoltaic devices and organic thin film transistors) are likewise susceptible to attack from exterior environmental species, including water and oxygen.

SUMMARY OF THE INVENTION

The above and other challenges are addressed by the present invention. According to an embodiment of the present invention, an organic optoelectronic device structure is provided which comprises the following: (a) a polymer substrate layer; (b) a first barrier region, which comprises two or more planarizing layers and two or more high-density layers, disposed over the polymer substrate layer; (c) a second barrier region, which comprises two or more planarizing layers, two or more high-density layers and at least one layer of an absorbing material that absorbs water, oxygen or both water and oxygen, disposed over the first barrier region; and (d) an organic optoelectronic device, which is selected from an organic light emitting diode, an organic electrochromic display, an organic photovoltaic device and an organic thin film transistor, disposed between the first and second barrier regions. The first and second barrier regions in this structure restrict transmission of water and oxygen from an outer environment to the optoelectronic device.

According to another embodiment, an organic optoelectronic device structure is provided that comprises the following: (a) a first barrier region; (b) a second barrier region; and (c) an organic optoelectronic device, which is selected from an organic light emitting diode, an organic electrochromic display, an organic photovoltaic device and an organic thin film transistor, disposed between the first barrier region and the second barrier region. In this structure, the first and second barrier regions restrict transmission of water and oxygen from an outer environment to the optoelectronic device. Moreover, at least one of the first and second barrier regions comprises the following: at least two planarizing layers, at least two high-density layers, and at least one layer of a material that absorbs water, oxygen or both water and oxygen.

According to another embodiment of the present invention, an OLED structure is provided that comprises: (a) a polymer substrate layer; (b) a first barrier region disposed over the polymer substrate layer, which comprises two or more planarizing layers and two or more high-density layers; (c) a second barrier region disposed over the first barrier region, which comprises two or more planarizing layers, two or more high-density layers, and at least one layer of an absorbing material that absorbs water, oxygen or both water and oxygen; and (d) an OLED disposed between the first and second barrier regions. The first and second barrier regions in this structure restrict transmission of water and oxygen from an outer environment to the optoelectronic device.

In each of the above embodiments, the layer of absorbing material preferably comprises an alkaline earth metal, more preferably, calcium metal and/or barium metal, which is preferably grown under vacuum conditions.

Each of the first and second barrier regions preferably comprises three or more planarizing layers and three or more high-density layers.

Each of the first and second barrier regions also preferably comprises multiple layer pairs, wherein each layer pair consists of a planarizing layer adjacent a high-density layer. The layer of absorbing material can be disposed between two of these layer pairs.

In some embodiments, the first barrier region further comprises a layer of absorbing material that absorbs water, oxygen or both water and oxygen. In some instances, the layer of material that absorbs water, oxygen or both water and oxygen can be placed adjacent the polymer substrate layer.

In some embodiments, the first and/or second barrier region comprises at least three planarizing layers in an alternating series with at least three other layers. The at least three other layers in these embodiments comprise at least two high-density layers and at least one layer of material that absorbs water, oxygen or both water and oxygen.

In other embodiments, the first and/or second barrier region comprises at least three high-density layers in an alternating series with at least three other layers. The at least three other layers in these embodiments comprise at least two planarizing layers and at least one layer of material that absorbs water, oxygen or both water and oxygen.

One advantage of the present invention is that organic optoelectronic structures are produced that are protected by an effective barrier between the organic optoelectronic device and the ambient atmosphere, reducing the adverse effects of chemical species in the ambient atmosphere, such as moisture and oxygen.

Another advantage of the present invention is that organic optoelectronic devices can be encapsulated within a multi-layered structure. Such structures are advantageous, for example, in that they lend themselves to continuous processing techniques, such as web-based manufacturing methods, in that they are typically flexible and conformable to other surfaces, and in that they typically permit transmission of light.

These and other embodiments and advantages of the present invention will become readily apparent to those of ordinary skill in the art upon review of the disclosure to follow.

As is typically the case with such figures, the above are simplified schematic representations, and the actual structures will differ in numerous respects including the relative scale of the components.

DETAILED DESCRIPTION OF THE INVENTION

The present invention now will be described more fully hereinafter with reference to the accompanying drawings in which preferred embodiments of the invention are shown. This invention may, however, be embodied in different forms and should not be construed as limited to the embodiments set forth herein.

As used herein, a "layer" of a given material includes a region of that material whose thickness is small compared to both its length and width. Examples of layers include sheets, foils, films, laminations, coatings, and so forth. As used herein a layer need not be planar, but can be bent, folded or otherwise contoured, for example, to at least partially envelop another component.

Figure 1:
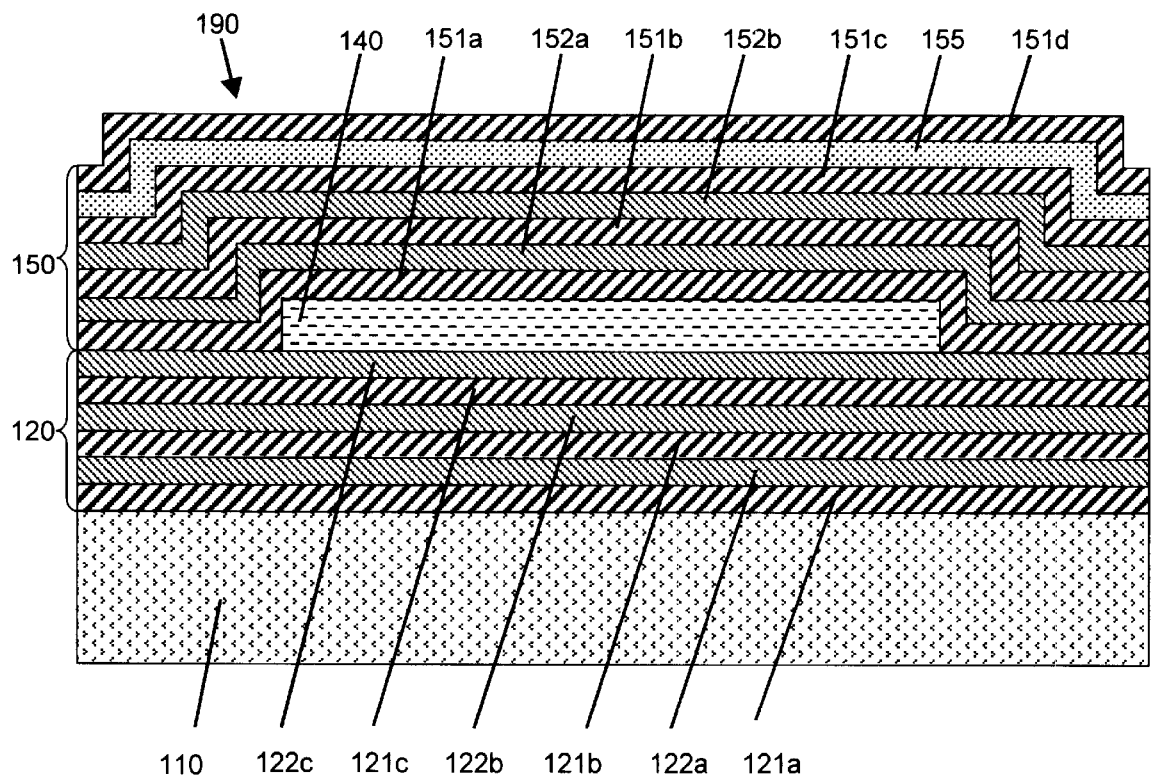
FIG. 1 is a cross-sectional view of an OLED structure, in accordance with an embodiment of the present invention.

FIG. 1 is a cross-sectional view of an OLED structure 190 in accordance with an embodiment of the present invention. The OLED structure 190 includes a substrate 110. On the substrate 110 is provided a first barrier region 120. An OLED 140 is situated on the first barrier region 120. A second barrier region 150 is disposed both on the OLED and on a region of the first barrier region 120 that surrounds the OLED. In this way, the first and second barrier regions 120, 150 cooperate to protect the OLED from outside species (e.g., atmospheric species such as water and oxygen) that may be harmful to the OLED (i.e., reduce the lifetime and/or efficiency of the OLED 140).

The OLED 140 can be any OLED known in the art. For example, as noted above, the OLED will generally comprise an anode layer (typically transparent), a cathode layer, and a light-emitting layer (emission layer) disposed between the anode and cathode layer. The light emitting layer can be provided in connection with a number of configurations, including the following: (a) a three-layer configuration comprising a hole transporting layer, an emission layer and an electron transporting layer (i.e., a double heterostructure configuration), (b) a two-layer configuration comprising a hole transporting layer and a layer that provides both emission and electron transporting functions (i.e., a single heterostructure configuration) and (c) a configuration comprising a single layer that provides hole transporting, electron transporting and emission functions (i.e., a single layer configuration). In each configuration, additional layers may also be present, for example, layers that enhance hole injection or electron injection, or layers that serve to block holes or electrons. Several structures for such devices are discussed, for example, in U.S. Pat. No. 5,707,745, the entire disclosure of which is hereby incorporated by reference. Other more complex OLED architecture is also practiced in the art.

Although an OLED 140 is shown in connection with the various figures, other organic optoelectronic devices, such as organic electrochromic displays, organic photovoltaic devices and organic thin film transistors, can be used in place of the OLED 140 that is shown.

As previously noted, the first and second barrier regions 120, 150 cooperate to block the transport of oxygen, water and any other harmful molecules from the exterior environment to the OLED 140. Moreover, due to their design, one or both of these regions can permit transmission of light between the OLED 140 and the outside environment. The first and second barrier regions 120, 150 are also typically flexible and conformable to other surfaces, and they can be manufactured using continuous (e.g., web-based) manufacturing techniques.

The first barrier region 120 contains a plurality of cooperative barrier layers that include both layers of planarizing material 121a–c and layers of high-density material 122a–c. These cooperative barrier layers are preferably provided in an alternating configuration. Preferably, 1 to 10 pairs of these layers, more preferably 3 to 7 pairs, are used.

The cooperative barrier layers 121a–c and 122a–c are disposed on the polymeric substrate layer 110 in the embodiment shown in FIG. 1. During manufacture, the substrate layer 110 acts as a foundation upon which the cooperative barrier layers 121a–c and 122a–c can be laid.

Preferred materials for the polymer substrate layer 110 include polyesters, polyethersulphones, polyimides and fluorocarbons that are capable of providing a strong adhesive bond with other materials. Preferred polyesters include polyethylene terephthalate. Preferred fluorocarbon polymers include Aclar® fluoropolymer available from Honeywell. The polymer substrate layer 110 typically ranges from 75 to 625 microns in thickness.

By "planarizing material" is meant a material that forms a smooth planar surface upon application, rather than forming a surface that reflects small-scale, irregular contours of the underlying surface. Preferred planarizing materials include polymers, such as fluorinated polymers, parylenes, cyclotenes, polyesters (such as polyethylene terephthalate) and polyacrylates. Layers of such planarizing materials can be provided using techniques known in the art, for example, by dipping, spin coating, sputtering, evaporative coating, spraying, flash evaporation, chemical vapor deposition and so forth.

By "high-density material" is meant a material with atomic spacing that is sufficiently close such that diffusion of outside species, particularly water and oxygen, are hindered. Preferred high-density materials include inorganic materials such as metal oxides, metal nitrides, metal carbides and metal oxynitrides. More preferred are silicon oxides (SiOx), including silicon monoxide (SiO) and silicon dioxide ($SiO_2$), silicon nitrides (typically $Si_3N_4$), silicon oxynitrides, aluminum oxides (typically $Al_2O_3$), indium-tin oxides (ITO) and zinc indium tin oxides. Layers of high-density material can be applied using techniques known in the art such as thermal evaporation, sputtering, PECVD methods and electron-beam techniques.

Examples of composite barrier regions comprising layers of both high-density material and planarizing material formed on a polymer substrate layer are disclosed, for example, in U.S. Pat. No. 5,757,126, the entire disclosure of which is hereby incorporated by reference.

Like the first barrier region 120, the second barrier region 150 contains a plurality of cooperative barrier layers that include both layers of planarizing material 151a–d and layers of high-density material 152a–b. Moreover, the second barrier region 150 also includes a moisture- and oxygen-absorbing layer 155. In the structure of FIG. 1, the moisture- and oxygen-absorbing layer 155 can be thought of as replacing a high-density layer that otherwise might have been included in the structure under an alternating cooperative barrier layer scheme.

Appropriate materials for moisture- and oxygen-absorbing layers such as layer 155 include reactive metals. Preferred reactive metals include alkaline earth metals, such as calcium metal and barium metal. A layer of such a metal can be deposited on an underlying layer (e.g., the planarizing layer 151c in FIG. 1) by known vacuum techniques including thermal evaporation, e-beam deposition and sputtering. Such techniques can also be used to deposit planarizing layers (e.g., layers 151a–d) and high-density layers (e.g., layers 152a–b), providing the opportunity for processing uniformity.

Figure 2:
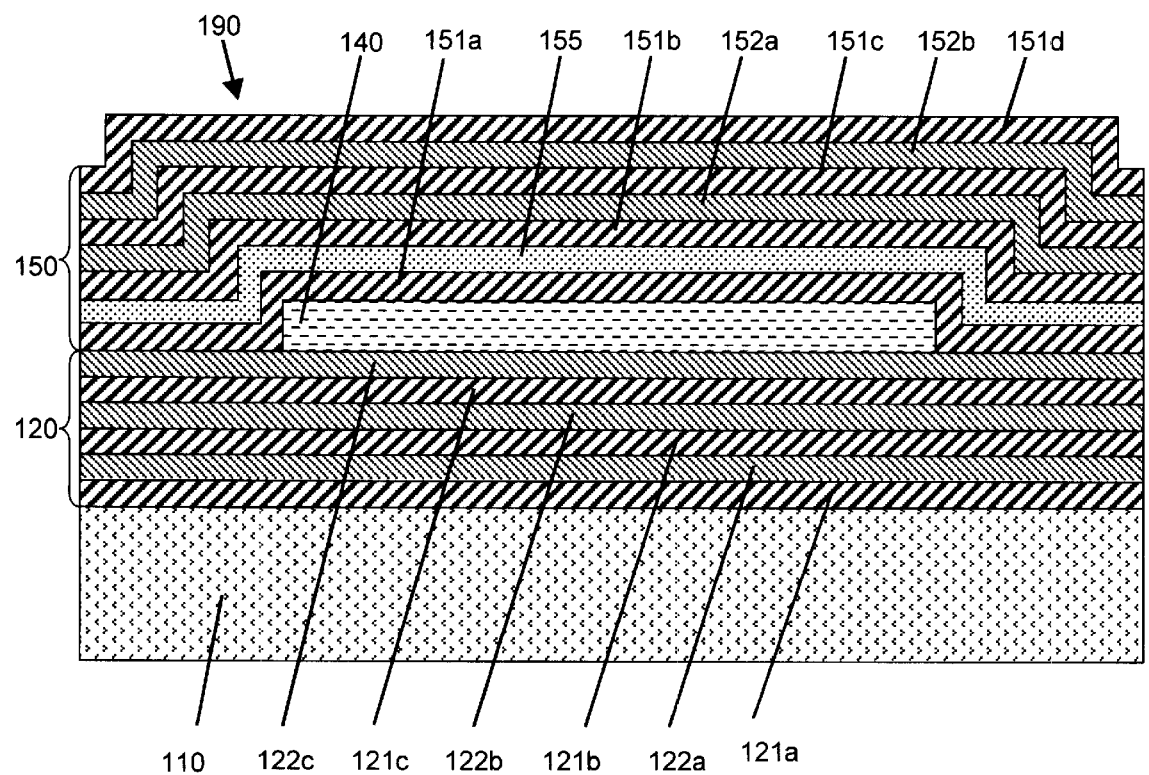
FIG. 2 is a cross-sectional view of an OLED structure, in accordance with another embodiment of the present invention.

Although it is preferably disposed near an outer surface of the barrier region, the placement of the moisture- and oxygen-absorbing layer within the barrier region is not critical. For example, the embodiment of the invention shown in FIG. 2 is like that of FIG. 1, except that the moisture- and oxygen-absorbing layer 155 is disposed between planarizing layers 151a and 151b (rather than between planarizing layers 151c and 151d), placing the moisture- and oxygen-absorbing layer 155 substantially closer to the OLED 140. As in FIG. 1, the moisture- and oxygen-absorbing layer 155 can be thought of as replacing a high-density layer that otherwise might have been included in the structure under an alternating cooperative barrier layer scheme.

Figure 3:
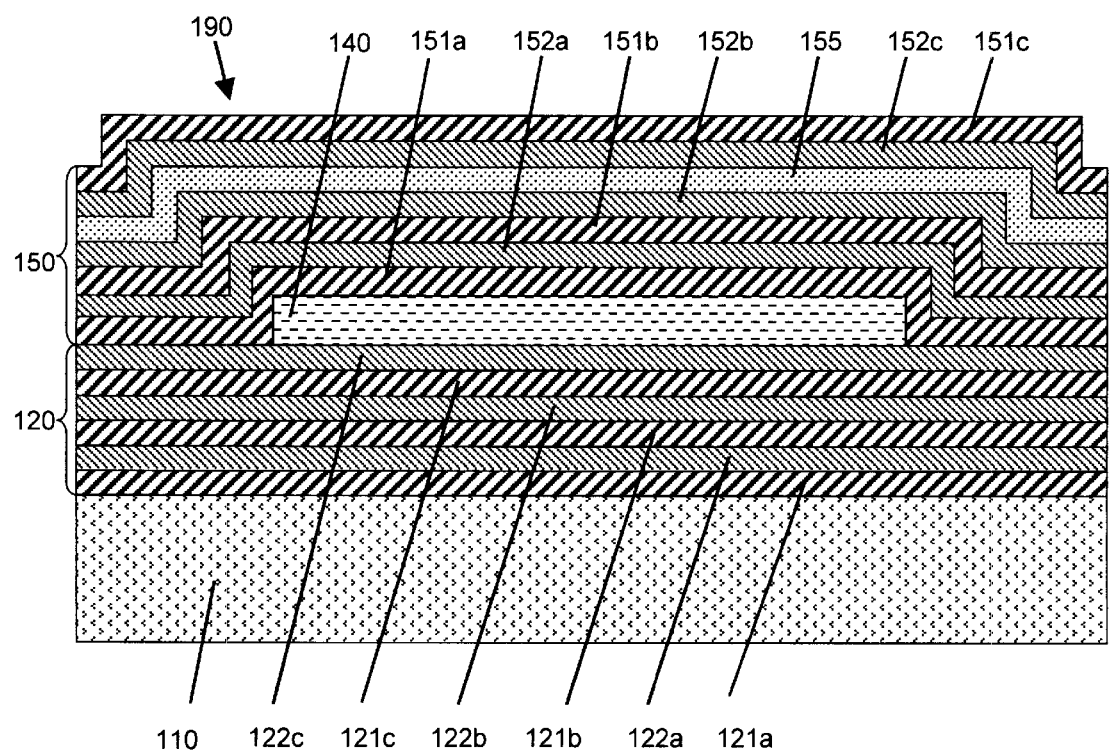
FIG. 3 is a cross-sectional view of an OLED structure, in accordance with another embodiment of the present invention.

Indeed, the moisture- and oxygen-absorbing layer can be positioned essentially anywhere within a given barrier region. For example, turning now to FIG. 3, the moisture- and oxygen-absorbing layer 155 is provided between high-density layer 152b and high-density layer 152c. In this case, and in contrast to FIG. 1 and FIG. 2, the moisture- and oxygen-absorbing layer 155 can be thought of as replacing a planarizing layer that otherwise would have been included in the structure under an alternating cooperative barrier layer scheme.

Figure 4:
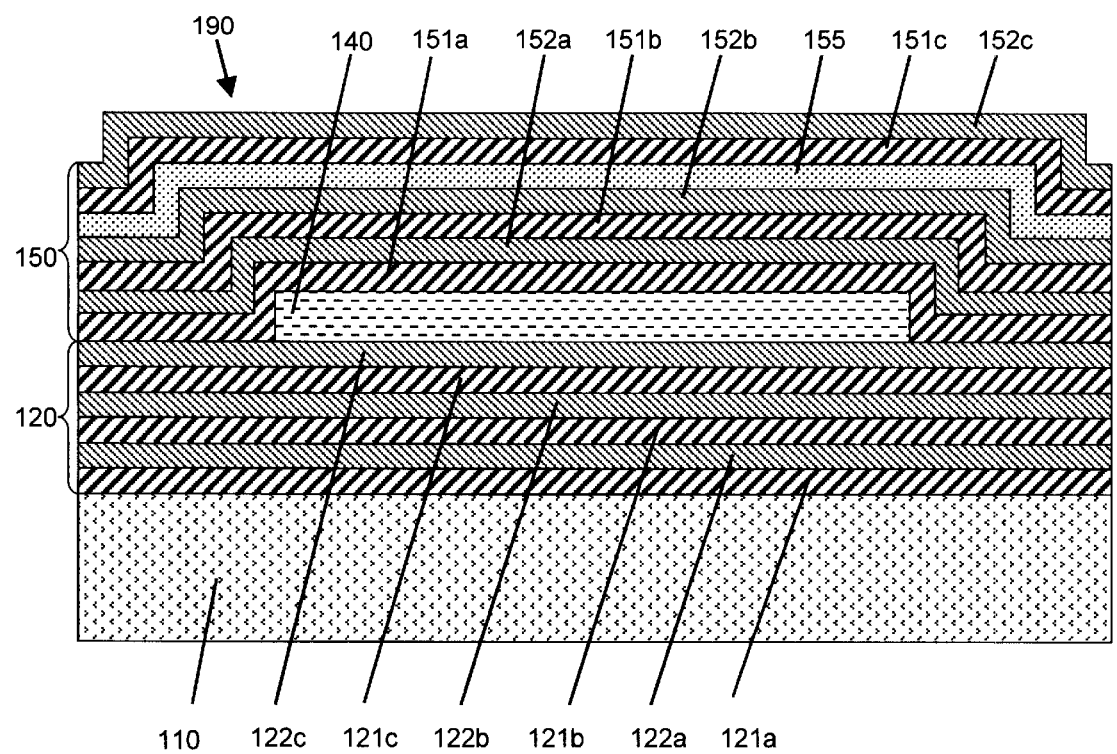
FIG. 4 is a cross-sectional view of an OLED structure in accordance with another embodiment of the present invention.

As a further example, within a given alternating cooperative barrier layer scheme, the moisture- and oxygen-absorbing layer need not replace any cooperative barrier layer, whether a high-density layer or a planarizing layer. Referring now to FIG. 4, a moisture- and oxygen-absorbing layer 155 is provided between a high-density layer 152b and a planarizing layer 151c. In this structure, the barrier region can be thought of as having: (a) a first dyad (defined herein as a pair of layers consisting of a planarizing layer and a high-density layer) consisting of planarizing layer 151a and high-density layer 152a, (b) adjacent a second dyad consisting of planarizing layer 1511b and high-density layer 152b, (c) adjacent a moisture- and oxygen-absorbing layer 155, (d) adjacent a third dyad consisting of planarizing layer 151c and high-density layer 152c.

Although not illustrated herein, more than one moisture- and oxygen-absorbing layer can be provided within a single barrier region.

Innumerable other combinations of moisture- and oxygen-absorbing layers, planarizing layers and high-density layers within a given barrier region will become readily apparent in view of the above discussion.

Figure 5:
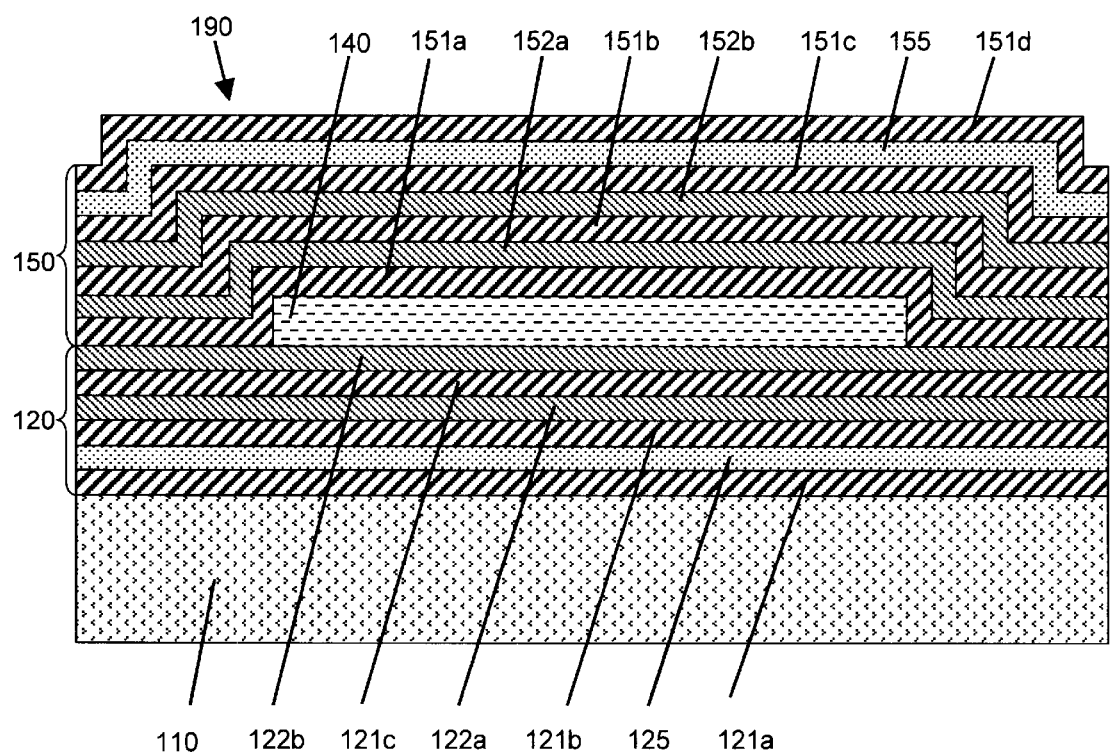
FIG. 5 is a cross-sectional view of an OLED structure in accordance with another embodiment of the present invention.

Barrier regions on both sides of the OLED can be provided with moisture- and oxygen-absorbing layers. For example, referring now to FIG. 5, barrier region 150 contains planarizing layers 151a–d, high-density layers 152a–b and a moisture- and oxygen-absorbing layer 155 as in FIG. 1. In contrast to the barrier region 120 of FIG. 1, however, the barrier region 120 of FIG. 5 contains a moisture- and oxygen-absorbing layer 125, as well as planarizing layers 121a–c and high-density layers 122a–b. Hence, the OLED structure of FIG. 5 can be thought of as being the same as the OLED structure 190 of FIG. 1, except that the lower high-density layer of FIG. 1 is replaced with a moisture- and oxygen-absorbing layer 125.

Figure 6:
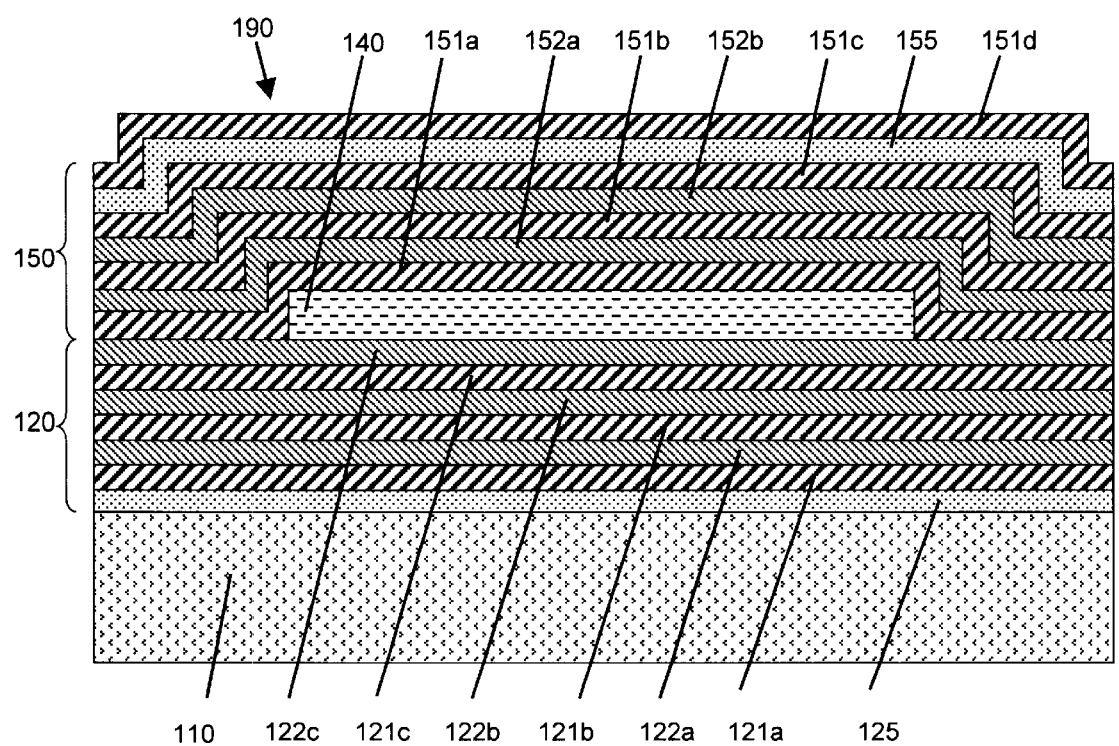
FIG. 6 is a cross-sectional view of an OLED structure in accordance with another embodiment of the present invention.

Another embodiment of the invention in which barrier regions on both sides of the OLED are provided with a moisture- and oxygen-absorbing layers is shown in FIG. 6. The OLED structure of FIG. 6 can be thought of as being the same as the OLED structure of FIG. 1, except that a moisture- and oxygen-absorbing layer 125 is provided between the substrate layer 110 and the lower planarizing layer 121a.

Although the present invention has been described with respect to several exemplary embodiments, there are many other variations of the above-described embodiments that will be apparent to those of ordinary skill in the art. It is understood that these variations are within the teachings of the present invention, and that the invention is to be limited only by the claims appended hereto.

What is claimed is:

1. An organic optoelectronic device structure comprising:
   a polymer substrate layer;
   a first barrier region disposed over said polymer substrate layer, said first barrier region comprising at least three planarizing layers in an alternating series with at least three other layers, said at least three other layers comprising at least two high-density layers and a layer of material that absorbs water, oxygen or both water and oxygen;
   a second barrier region disposed over said first barrier region, said second barrier region comprising two or more planarizing layers, two or more high-density layers and a layer of an absorbing material that absorbs water, oxygen or both water and oxygen; and an organic optoelectronic device selected from an organic light emitting diode, an organic electrochromic display, an organic photovoltaic device and an organic thin film transistor, said organic optoelectronic device disposed between said first and second barrier regions, wherein said first barrier region and said second barrier region restrict transmission of water and oxygen from an outer environment to said optoelectronic device.

2. The organic optoelectronic device structure of claim 1, wherein said layers of absorbing material comprise an alkaline earth metal.

3. The organic optoelectronic device structure of claim 2, wherein said layers of absorbing material comprise calcium metal, barium metal or both calcium metal and barium metal.

4. The organic optoelectronic device structure of claim 1, wherein said second barrier region comprises at least first and second layer pairs, wherein each said layer pair consists of a planarizing layer adjacent a high-density layer.

5. The organic optoelectronic device structure of claim 1, wherein each of said first and second barrier regions comprises three or more planarizing layers and three or more high-density layers.

6. An OLED structure comprising:

a polymer substrate layer;

a first barrier region disposed over said polymer substrate layer, said first barrier region comprising at least three planarizing layers in an alternating series with at least three other layers, said at least three other layers comprising at least two high-density layers and a layer of material that absorbs water, oxygen or both water and oxygen;

a second barrier region disposed over said first barrier region, said second barrier region comprising two or more planarizing layers, two or more high-density layers and a layer of an absorbing material that absorbs water, oxygen or both water and oxygen; and an OLED disposed between said first and second barrier regions, wherein said first barrier region and said second barrier region restrict transmission of water and oxygen from an outer environment to said optoelectronic device.

7. The OLED structure of claim 6, wherein said layers of absorbing material comprise an alkaline earth metal.

8. The OLED structure of claim 7, wherein said layers of absorbing material are grown under vacuum conditions.

9. The OLED structure of claim 7, wherein said layers of absorbing material comprise calcium metal.

10. The OLED structure of claim 7, wherein said layers of absorbing material comprise barium metal.

11. The OLED structure of claim 6, wherein said first and second barrier regions each comprises three or more planarizing layers and three or more high-density layers.

12. The OLED structure of claim 6, wherein said first and second barrier regions each comprises at least first and second layer pairs, wherein each said layer pair consists of a planarizing layer adjacent a high-density layer.

13. The OLED structure of claim 12, wherein, for each of said first and second barrier regions, said layer of absorbing material is disposed between said first and second layer pairs.

14. The OLED structure of claim 6, wherein said second barrier region comprises at least three planarizing layers in an alternating series with at least three other layers, said at least three other layers comprising at least two high-density layers and a layer of material that absorbs water, oxygen or both water and oxygen.

15. The OLED structure of claim 6, wherein said second barrier region comprises at least three high-density layers in an alternating series with at least three other layers, said at least three other layers comprising at least two planarizing layers and a layer of material that absorbs water, oxygen or both water and oxygen.

16. The OLED structure of claim 6, wherein said first barrier region comprises at least first and second layer pairs, each said layer pair consisting of a planarizing layer adjacent a high-density layer, and wherein said layer of absorbing material is disposed between said first and second layer pairs.

17. The OLED structure of claim 6, wherein a layer of material that absorbs water, oxygen or both water and oxygen is adjacent said polymer substrate layer.

18. The OLED structure of claim 6, wherein said planarizing layers comprise a material selected from fluorinated polymers, parylenes, cyclotenes, polyesters and polyacrylates.

19. The OLED structure of claim 6, wherein said high-density layers comprise a material selected from metal oxides, metal nitrides, metal carbides and metal oxynitrides.

20. The OLED structure of claim 6, wherein said high-density layers comprise a material selected from silicon oxide, silicon nitride, silicon oxynitride, aluminum oxide, indium tin oxide and zinc indium tin oxide.

21. The OLED structure of claim 6, wherein said polymer substrate layer comprises a material selected from a fluorocarbon polymer, a polyethersulphone, a polyimide, a polyolefin, and a polyester.

* * * * *

UNITED STATES PATENT AND TRADEMARK OFFICE
CERTIFICATE OF CORRECTION

PATENT NO.   : 6,624,568 B2
DATED        : September 23, 2003
INVENTOR(S)  : Silvernail It is certified that error appears in the above-identified patent and that said Letters Patent is hereby corrected as shown below:

<u>Column 6,</u>
Line 16, "1511b" should be -- 151b --

Signed and Sealed this

Second Day of March, 2004

JON W. DUDAS
*Acting Director of the United States Patent and Trademark Office*